United States Patent
Kan et al.

(10) Patent No.: US 10,707,651 B2
(45) Date of Patent: Jul. 7, 2020

(54) SEMICONDUCTOR LASER ELEMENT

(71) Applicant: SHARP KABUSHIKI KAISHA, Sakai, Osaka (JP)

(72) Inventors: Yasuo Kan, Sakai (JP); Ryuhichi Sogabe, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/389,761

(22) Filed: Apr. 19, 2019

(65) Prior Publication Data

US 2019/0379179 A1 Dec. 12, 2019

Related U.S. Application Data

(60) Provisional application No. 62/682,712, filed on Jun. 8, 2018.

(51) Int. Cl.
| | |
|---|---|
| *H01S 5/00* | (2006.01) |
| *H01S 5/223* | (2006.01) |
| *H01S 5/22* | (2006.01) |
| *H01S 5/022* | (2006.01) |
| *H01S 5/343* | (2006.01) |

(52) U.S. Cl.
CPC ........ *H01S 5/2238* (2013.01); *H01S 5/02272* (2013.01); *H01S 5/22* (2013.01); *H01S 5/2202* (2013.01); *H01S 5/34326* (2013.01); *H01S 2304/04* (2013.01)

(58) Field of Classification Search
CPC .. H01S 5/2238; H01S 5/2202; H01S 5/02272; H01S 5/34326; H01S 2304/04
See application file for complete search history.

(56) References Cited

U.S. PATENT DOCUMENTS

| | | | | |
|---|---|---|---|---|
| 2002/0018499 | A1* | 2/2002 | Kuniyasu | H01S 5/024 372/36 |
| 2006/0239318 | A1* | 10/2006 | Kunimasa | H01S 5/2231 372/36 |
| 2007/0076772 | A1* | 4/2007 | Horiguchi | H01S 5/04254 372/43.01 |
| 2007/0104237 | A1* | 5/2007 | Matsumoto | H01S 5/0224 372/43.01 |
| 2010/0254421 | A1* | 10/2010 | Iga | H01S 5/4031 372/46.01 |

(Continued)

FOREIGN PATENT DOCUMENTS

| | | |
|---|---|---|
| JP | 2001-189530 A | 7/2001 |
| JP | 2002-009382 A | 1/2002 |

(Continued)

*Primary Examiner* — Kinam Park
(74) *Attorney, Agent, or Firm* — ScienBiziP, P.C.

(57) ABSTRACT

A semiconductor laser element that includes a stripe-shaped light-emitting region and that is formed by adhering a surface of the semiconductor laser element on a side opposite to a semiconductor substrate and a submount to each other by a solder layer includes a terrace section on a surface of the semiconductor laser element that is adhered by the solder layer, the terrace section being separated from a ridge portion, which is a current-carrying portion, by a grooved portion. A top surface of a region including the grooved portion is covered by a metal. The terrace section is divided into a plurality of portions that are disposed in a scattered manner.

7 Claims, 8 Drawing Sheets

(56) References Cited

U.S. PATENT DOCUMENTS

2013/0308667 A1 11/2013 Hagino et al.
2017/0338622 A1* 11/2017 Kitajima ................. H01S 5/22

FOREIGN PATENT DOCUMENTS

| | | |
|---|---|---|
| JP | 2006-032778 A | 2/2006 |
| JP | 2006-128189 A | 5/2006 |
| JP | 2006-173265 A | 6/2006 |
| JP | 2012-222205 A | 11/2012 |
| JP | 5103008 B2 | 12/2012 |
| JP | 2014-072495 A | 4/2014 |
| JP | 2017-208399 A | 11/2017 |
| WO | 2012/101686 A1 | 8/2012 |

* cited by examiner

B-B

C-C

SEMICONDUCTOR LASER ELEMENT

BACKGROUND OF INVENTION

Field of Invention

The present invention relates to a semiconductor laser element, such as a semiconductor laser element that operates at a high temperature or a high output.

Related Art

Hitherto, as a semiconductor laser element used as a light source for reading information from or writing information onto, for example, a DVD (digital versatile disk), there has existed, for example, a semiconductor laser element described in Japanese Unexamined Patent Application Publication No. 2002-9382.

FIG. 8A and FIG. 8B are each an explanatory view for describing an example of an existing semiconductor laser element 1000. FIG. 8A is a plan view schematically showing the existing semiconductor laser element 1000. FIG. 8B is a schematic sectional view of the existing semiconductor laser element 1000 along line C-C shown in FIG. 8A. FIG. 8A does not illustrate a SiO$_2$ film 1011 and a TiAu/Au plated electrode 1012.

The semiconductor laser element 1000 includes an n-type GaAs buffer layer 1002, an n-type GaInP buffer layer 1003, an n-type AlGaInP first cladding layer 1004, an undoped AlGaInP first guide layer 1005, an undoped GaInP/AlGaInP multiple quantum well active layer 1006, an undoped AlGaInP second guide layer 1007, a p-type AlGaInP second cladding layer 1008, a p-type GaInP intermediate layer 1009, and a p-type GaAs cap layer 1010, which are formed on an n-type GaAs substrate 1001. The undoped GaInP/AlGaInP multiple quantum well active layer 1006 is sometimes simply called "active layer" below.

A stripe-shaped ridge portion 1151 is formed at the p-type AlGaInP second cladding layer 1008, the p-type GaInP intermediate layer 1009, and the p-type GaAs cap layer 1010, and a terrace section 1152 and a terrace section 1153 are formed on respective sides thereof. The top surfaces of the terrace sections 1152 and 1153 are flat surfaces.

The SiO$_2$ film 1011 covers the side surfaces of the ridge portion 1151 and the top surface and the side surfaces of each of the terrace sections 1152 and 1153.

In the semiconductor laser element 1000, the TiAu/Au plated electrode 1012 is formed as a first electrode, and a AuGeNi electrode 1013 is formed as a second electrode. The TiAu/Au plated electrode 1012 is connected to the top surface of the ridge portion 1151.

When the semiconductor laser element 1000 is to be manufactured, first, the n-type GaAs buffer layer 1002, the n-type GaInP buffer layer 1003, the n-type AlGaInP first cladding layer 1004, the undoped AlGaInP first guide layer 1005, the active layer 1006, the undoped AlGaInP second guide layer 1007, the p-type AlGaInP second cladding layer 1008, the p-type GaInP intermediate layer 1009, and the p-type GaAs cap layer 1010 are caused to successively grow on the n-type GaAs substrate 1001 by, for example, a metal organic chemical vapor deposition method (MOCVD method).

Next, by a photolithography process, a part of the p-type AlGaInP second cladding layer 1008, a part of the p-type GaInP intermediate layer 1009, and a part of the p-type GaAs cap layer 1010 are removed to form the ridge portion 1151 extending in a resonator direction R. At this time, the terrace sections 1152 and 1153 are also formed.

Next, after covering a region excluding a surface of the ridge portion 1151 with the SiO$_2$ film 1011, the TiAu/Au plated electrode 1012 and the AuGeNi electrode 1013 are formed. At this time, the TiAu/Au plated electrode 1012 is acquired by, after forming an ohmic electrode, such as a TiAu ohmic electrode, forming a Au plated electrode with a thickness of, for example, 2 μm for heat dissipation.

Lastly, by performing an element dividing process, a plurality of semiconductor laser elements are acquired.

Each semiconductor laser element 1000 manufactured in this way is fixed to a submount (mounting base) (not shown), which is a heat-dissipating component, by a solder layer (not shown), such as a AuSn solder layer. At this time, each semiconductor laser element 1000 is fixed such that a side of the p-type GaAs cap layer 1010 near the active layer 1006, which is a heating source, is near the submount.

The semiconductor laser element 1000 has a property in which an operating current increases as the temperature increases. By dissipating heat to the submount, an increase in the operating current caused by the temperature increase is reduced.

When an electrical current is caused to flow through the ridge portion 1151, light is confined below the ridge portion 1151, and laser light is generated mainly by the active layer 1006, which is disposed below the ridge portion 1151.

If the terrace sections 1152 and 1153 have been individually formed, a large stress is applied to the protruding ridge portion 1151 when fixing to the submount, as a result of which problems, such as the semiconductor laser elements becoming less reliable, occur. In a structure in which only the ridge portion 1151 protrudes, there is no support when fixing to the submount and each semiconductor laser element 1000 tilts, as a result of which radiation characteristics and polarization characteristics vary.

In order to prevent the occurrence of such problems, the terrace section 1152 is formed on one side of the ridge portion 1151 via, for example, a groove having a width of 5 μm, and the terrace section 1153 is formed on another side of the ridge portion 1151 via, for example, a groove having a width of 5 μm. Therefore, when each semiconductor laser element 1000 has been fixed to the submount, the terrace sections 1152 and 1153 become supports, as a result of which it is possible to prevent a large stress from being applied to the ridge portion 1151 and to prevent each semiconductor laser element 1000 from tilting.

In each semiconductor laser element 1000, heat generated by the active layer 1006 disposed below the ridge portion 1151 or heat generated by the ridge portion 1151, which is a current path, is caused to escape to the submount via the TiAu/Au plated electrode 1012.

In the semiconductor laser element described in Japanese Unexamined Patent Application Publication No. 2014-72495, recessed portions in a resonance direction and recessed portions in a width direction are formed in the terrace sections. In the semiconductor laser element described in Japanese Unexamined Patent Application Publication No. 2006-173265, only the top portion of the insulating film that coats the surface of the semiconductor laser element and the side surfaces of the ridge-shaped waveguide has a vertical or a parallel or a lattice-like uneven shape. In the semiconductor laser element described in Japanese Unexamined Patent Application Publication No. 2017-208399, a dividing structure including a groove that divides the active layer in a resonance direction is formed between waveguide structures that are adjacent to each other. In the semiconductor laser element described in Japanese Patent No. 5103008, two grooves formed in a resonance direction from the top surface of the second-conductivity-type second cladding layer to the inside of the semiconductor substrate are provided.

However, existing heat-dissipating techniques such as those described above are not sufficient. In particular, in a red semiconductor laser element formed from AlGaInP-based semiconducting crystals, the shorter the oscillation wavelength is set, the lower is the energy barrier between the active layer and the barrier layer, as a result of which the proportion at which carriers of the active layer escape to the barrier wall at high temperatures is increased. As a result, the operating current increases considerably at high temperatures, thereby hindering high-temperature operations. The semiconductor laser element described in Japanese Unexamined Patent Application Publication No. 2006-128189 only includes recessed portions in the top surface of the ridge portion, and, thus, does not propose a solution to the problems described in the present invention.

Accordingly, it is an object of the present invention to provide a semiconductor laser element that can enhance operating temperatures than before.

SUMMARY OF INVENTION (1) An embodiment of the present invention is a semiconductor laser element that includes a stripe-shaped light-emitting region and that is formed by adhering a surface of the semiconductor laser element on a side opposite to a semiconductor substrate and a submount to each other by a solder layer. The semiconductor laser element includes a terrace section on a surface of the semiconductor laser element that is adhered by the solder layer, the terrace section being separated from a ridge portion, which is a current-carrying portion, by a grooved portion. A top surface of a region including the grooved portion is covered by a metal, and the terrace section is divided into a plurality of portions that are disposed in a scattered manner.

(2) A certain embodiment of the present invention is a semiconductor laser element having, in addition to the structure of (1) above, a structure in which the terrace section is regularly divided.

(3) A certain embodiment of the present invention is a semiconductor laser element having, in addition to the structure of (1) above or the structure of (2) above, a structure in which the terrace section is divided in a form of a lattice by vertical and horizontal recessed portions.

(4) A certain embodiment of the present invention is a semiconductor laser element having, in addition to any one of the structures from (1) above to (3) above, a structure in which the terrace section is split into a plurality of portions in a resonator direction, and the terrace section does not exist in at least a part of a location up to a side-surface region, which is a region of a side surface in the resonator direction.

(5) A certain embodiment of the present invention is a semiconductor laser element having, in addition to any one of the structures from (1) above to (4) above, a structure in which the terrace section is formed at only regions of four corners.

(6) Another embodiment of the present invention is a semiconductor laser element that includes a stripe-shaped light-emitting region and that is formed by adhering a surface of the semiconductor laser element on a side opposite to a semiconductor substrate and a submount to each other by a solder layer. The semiconductor laser element includes a terrace section on a surface of the semiconductor laser element that is adhered by the solder layer, the terrace section being separated from a ridge portion, which is a current-carrying portion, by a grooved portion. A top surface of a region including the grooved portion is covered by a metal, and a terrace width, which is a width of the terrace section, is not constant in a resonator direction, and the terrace width at at least a part of the terrace section is narrower than a width of the grooved portion between the terrace section and the ridge portion.

(7) Still another embodiment of the present invention is a semiconductor laser element that includes a stripe-shaped light-emitting region and that is formed by adhering a surface of the semiconductor laser element on a side opposite to a semiconductor substrate and a submount to each other by a solder layer. The semiconductor laser element includes a terrace section on a surface of the semiconductor laser element that is adhered by the solder layer, the terrace section being separated from a ridge portion, which is a current-carrying portion, by a grooved portion. A top surface of a region including the grooved portion is covered by a metal, a terrace width, which is a width of the terrace section, is not constant in a resonator direction, and the terrace width over an entire region in the resonator direction is narrower than a width of the grooved portion between the terrace section and the ridge portion.

According to the present invention, it is possible to enhance operating temperatures than before.

DESCRIPTION OF PREFERRED EMBODIMENTS

Figure 1:
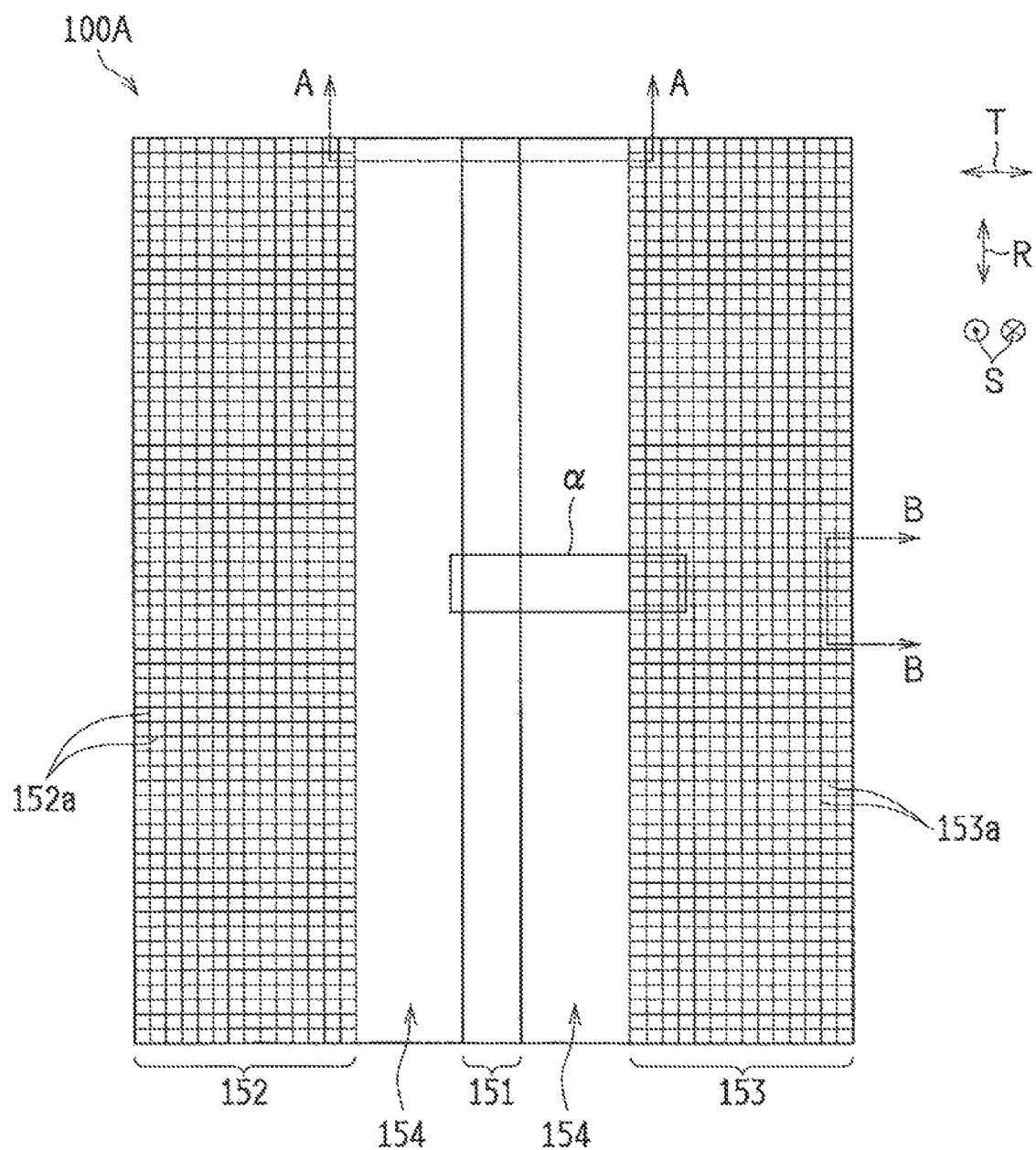
FIG. 1 is a plan view schematically showing a semiconductor laser element of Embodiment 1.

Regarding embodiments of the present invention, a red semiconductor laser using AlGaInP-based semiconducting crystals is described below. The present embodiments are also applicable to semiconductor laser elements using other types of crystals, such as AlGaAs-based crystals and AlGaInAs-based crystals. In the description below, the same components are given the same reference numerals. The names and functions thereof are also the same. Therefore, detailed descriptions thereof are not repeated.

Embodiment 1

Figure 2:
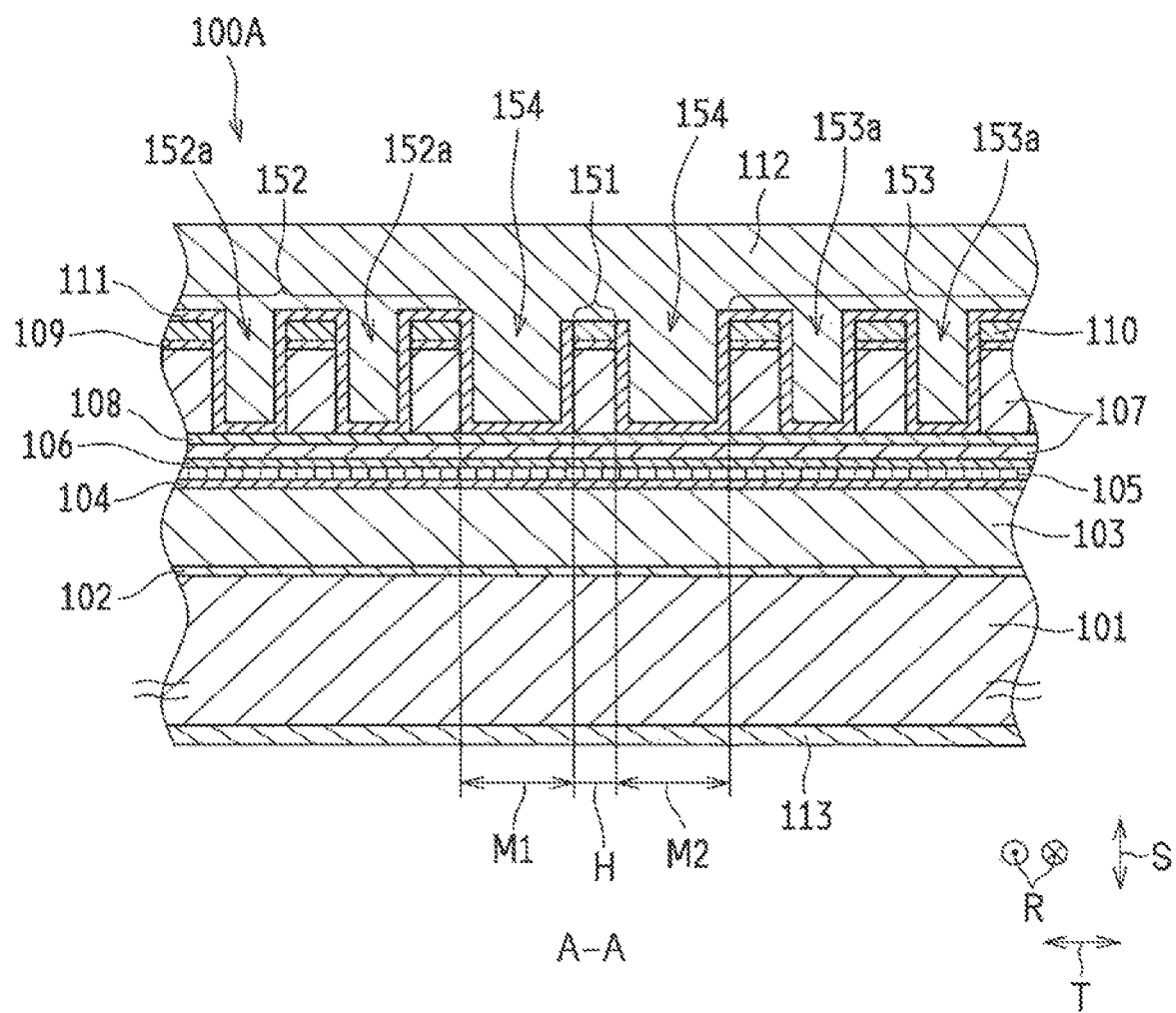
FIG. 2 is a schematic sectional view of the semiconductor laser element of Embodiment 1 along line A-A shown in FIG. 1.
Figure 3:
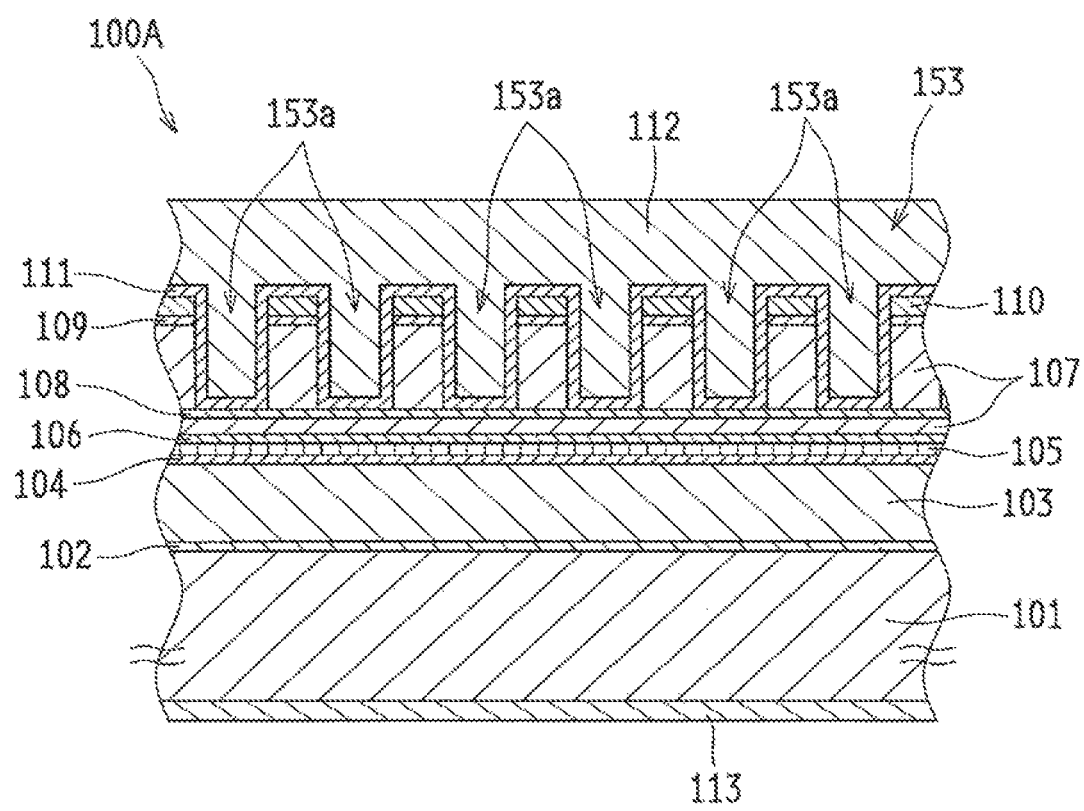
FIG. 3 is a schematic sectional view of the semiconductor laser element of Embodiment 1 along line B-B shown in FIG. 1.
Figure 4:
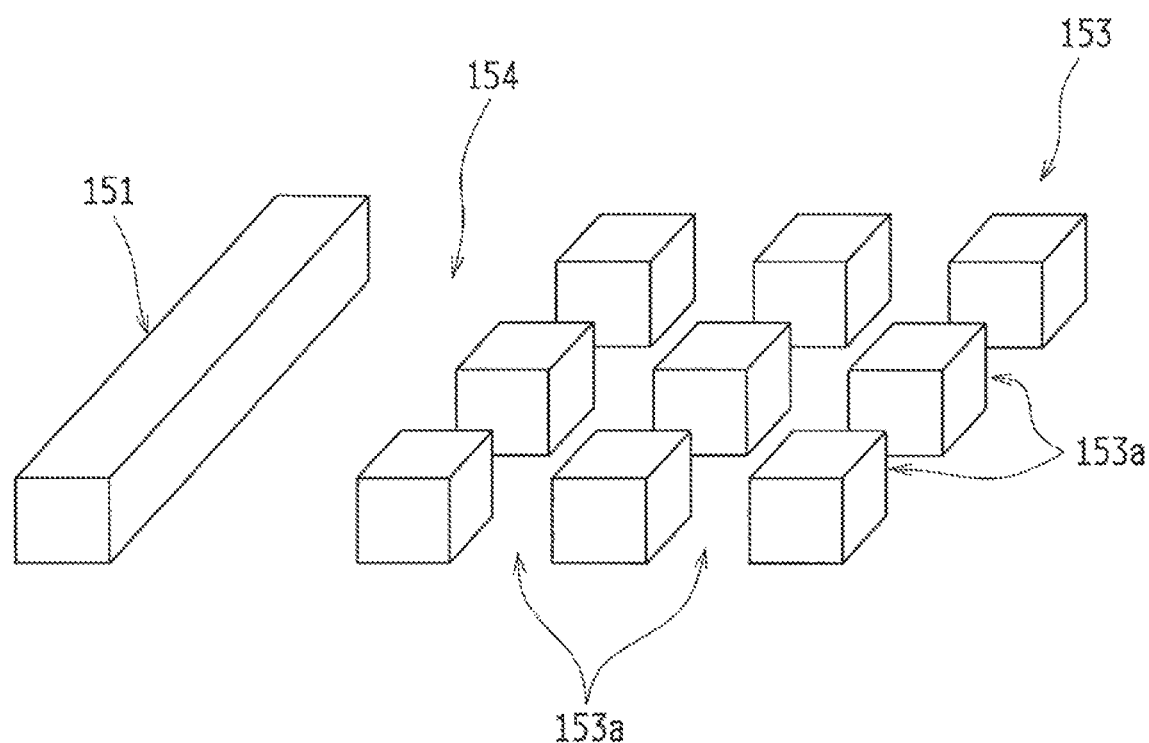
FIG. 4 is a perspective view of the semiconductor laser element of Embodiment 1 as seen from obliquely above a region a shown in FIG. 1.

FIG. 1 is a plan view schematically showing a semiconductor laser element 100A of Embodiment 1. FIG. 1 does not illustrate a SiO₂ film 111 and a TiAu/Au plated electrode 112. FIG. 2 is a schematic sectional view of the semiconductor laser element 100A of Embodiment 1 along line A-A shown in FIG. 1. FIG. 3 is a schematic sectional view of the semiconductor laser element 100A of Embodiment 1 along line B-B shown in FIG. 1. FIG. 3 is a perspective view of the semiconductor laser element 100A of Embodiment 1 as seen from obliquely above a region a shown in FIG. 1.

As shown in FIGS. 1 and 2, the semiconductor laser element 100A includes, in addition to an n-type GaAs substrate 101, an n-type GaInP buffer layer 102, an n-type AlGaInP first cladding layer 103, an undoped AlGaInP first guide layer 104, an undoped GaInP/AlGaInP multiple quantum well active layer 105, an undoped AlGaInP second guide layer 106, a p-type AlGaInP second cladding layer 107, a p-type GaInP etching stop layer 108, the p-type AlGaInP second cladding layer 107, a p-type GaInP intermediate layer 109, and a p-type GaAs cap layer 110, which are formed on the n-type GaAs substrate 101 by a metal organic vapor phase epitaxy (MOVPE) method. The n-type GaAs substrate 101 is an example of a semiconductor substrate, and may simply be called "semiconductor substrate" below. The multiple quantum well active layer 105 is an example of an active layer, and may simply be called "active layer" or "light-emitting section".

A ridge portion 151 and terrace sections 152 and 153 are formed on a side of the semiconductor laser element 100A opposite to a side of the n-type GaAs substrate 101 by a photolithography process. The terrace sections 152 and 153 are provided on corresponding sides of the ridge portion 151 with corresponding grooved portions 154 and 154 provided therebetween in a width direction T perpendicular to a resonator direction R and a film thickness direction S and extending in the resonator direction R. The ridge portion 151 and the terrace sections 152 and 153 are each formed by removing a part of the p-type AlGaInP second cladding layer 107, a part of the p-type GaInP intermediate layer 109, and a part of the p-type GaAs cap layer 110.

The SiO₂ film 111 covers the side surfaces of the ridge portion 151 and the top surface and the side surfaces of each of the terrace sections 152 and 153.

In the semiconductor laser element 100A, the TiAu/Au plated electrode 112 is formed as a first electrode, and a AuGeNi electrode 113 is formed as a second electrode. The TiAu/Au plated electrode 112 is connected to the top surface of the ridge portion 151. The TiAu/Au plated electrode 112 is an example of a metal, and may simply be called "metal" or "metal electrode" below.

When the above-described semiconductor laser element 100A is to be manufactured, first, the n-type GaInP (thickness: 0.25 µm) buffer layer 102, the n-type AlGaInP (Al composition ratio: 0.7; thickness: 3.0 µm) first cladding layer 103, the undoped AlGaInP (Al composition ratio: 0.55; thickness: 20 nm) first guide layer 104, the undoped GaInP (thickness: 4 nm)/AlGaInP (Al composition ratio: 0.55; thickness: 6 nm) multiple quantum well active layer 105, the undoped AlGaInP (Al composition ratio: 0.55; thickness: 20 nm) second guide layer 106, the p-type AlGaInP (Al composition ratio: 0.7; thickness: 1.5 µm) second cladding layer 107, the p-type GaInP (thickness: 13 nm) etching stop layer 108 formed in the p-type AlGaInP second cladding layer 107, the p-type GaInP (thickness: 35 nm) intermediate layer 109, and the p-type GaAs (thickness: 0.3 µm) cap layer 110 are caused to successively grow on the n-type GaAs substrate 101 by, for example, a metal organic chemical vapor deposition method (MOCVD method).

In Embodiment 1, after the p-type AlGaInP second cladding layer 107, the p-type GaInP intermediate layer 109, and the p-type GaAs cap layer 110 have been stacked upon each other in this order, dry etching is performed up to a location above the p-type GaInP etching stop layer 108. Thereafter, etching is performed until the etching is stopped at the p-type GaInP etching stop layer 108 to form the ridge portion 151 and the terrace sections 152 and 153.

Next, a region excluding the surface of the ridge portion 151 is covered by the SiO₂ (thickness: 0.1 µm) film 111. The SiO₂ film is an example of a dielectric film.

Next, the TiAu/Au plated electrode 112 is formed on the SiO₂ film 111 and the ridge portion 151. The AuGeNi electrode 113 is formed below the n-type GaAs substrate 101.

Here, in the semiconductor laser element 100A, a width (length in the width direction T) H of the ridge portion 151 is 1.7 µm, and an interval M1 between the ridge portion 151 and the terrace section 152 and an interval M2 between the ridge portion 151 and the terrace section 153 are 5.0 µm. In the semiconductor laser element 100A, the resonator length is 1500 µm, and the chip width is 110 µm. The oscillation wavelength of laser light is 640 nm. The resonator length means a length of the semiconductor laser element 100A in the resonator direction R. The chip width means the length of the semiconductor laser element 100A in the width direction T.

In the photolithography process of forming the ridge portion 151, lattice-like recessed portions 152a and 153a (recessed grooves) that divide the corresponding terrace sections 152 and 153 into a plurality of portions are formed in at least a part (the entire region in this example) of a corresponding one of the terrace sections 152 and 153. The ridge portion 151 is formed at the same time as the recessed portions 152a and 153a. The vertical and horizontal widths of the recessed portions 152a and 153a are predetermined dimensions equal to or substantially equal to each other (2 µm in this example). The interval between adjacent recessed portions (152a and 152a) is a predetermined dimension (2 µm in this example) equal to or substantially equal to the width of the recessed portions 152a and the interval between adjacent recessed portions (153a and 153a) is a predetermined dimension (2 µm in this example) equal to or substantially equal to the width of the recessed portions 153a. The depth of the recessed portions 152a and 153a is a predetermined dimension (1.3 µm in this example) equal to or substantially equal to the height of the ridge portion 151. By performing a subsequent electrode formation process, the recessed portions 152a in the terrace section 152 and the recessed portions 153a in the terrace section 153 are filled with the TiAu/Au plated electrode 112 with the SiO₂ film 111 in between. The thickness of the TiAu/Au plated electrode 112 is 2.5 µm.

Lastly, by performing an element dividing process, a plurality of semiconductor laser elements 100A to 100A are acquired.

Each semiconductor laser element 100A manufactured in this way is fixed to a submount (mounting base) (not shown), which is a heat-dissipating component, by a solder layer (not shown), such as a AuSn solder layer. At this time, each semiconductor laser element 100A is fixed such that a side of the p-type GaAs cap layer 110 near the active layer 105, which is a heating source, is near the submount.

The semiconductor laser element 100A has a property in which an operating current increases as the temperature increases, and a reduction in high-temperature operations is of concern. However, in Embodiment 1, the joining area between the semiconductor layers (102 to 111) and the metal electrode (112) is increased to improve heat-dissipation efficiency, as a result of which operating temperatures can be made higher than the operating temperatures of existing semiconductor laser elements that do not include the recessed portions 152*a* in the terrace section 152 and the recessed portions 153*a* in the terrace section 153.

Although, in Embodiment 1, an example in which the lattice-like recessed portions 152*a* and the lattice-like recessed portions 153*a* having the same widths and the same intervals are formed as the recessed portions 152*a* and 153*a* is described, the plurality of recessed portions 152*a* and 153*a* may be arranged with different widths or at different intervals.

Embodiment 2

Figure 5:
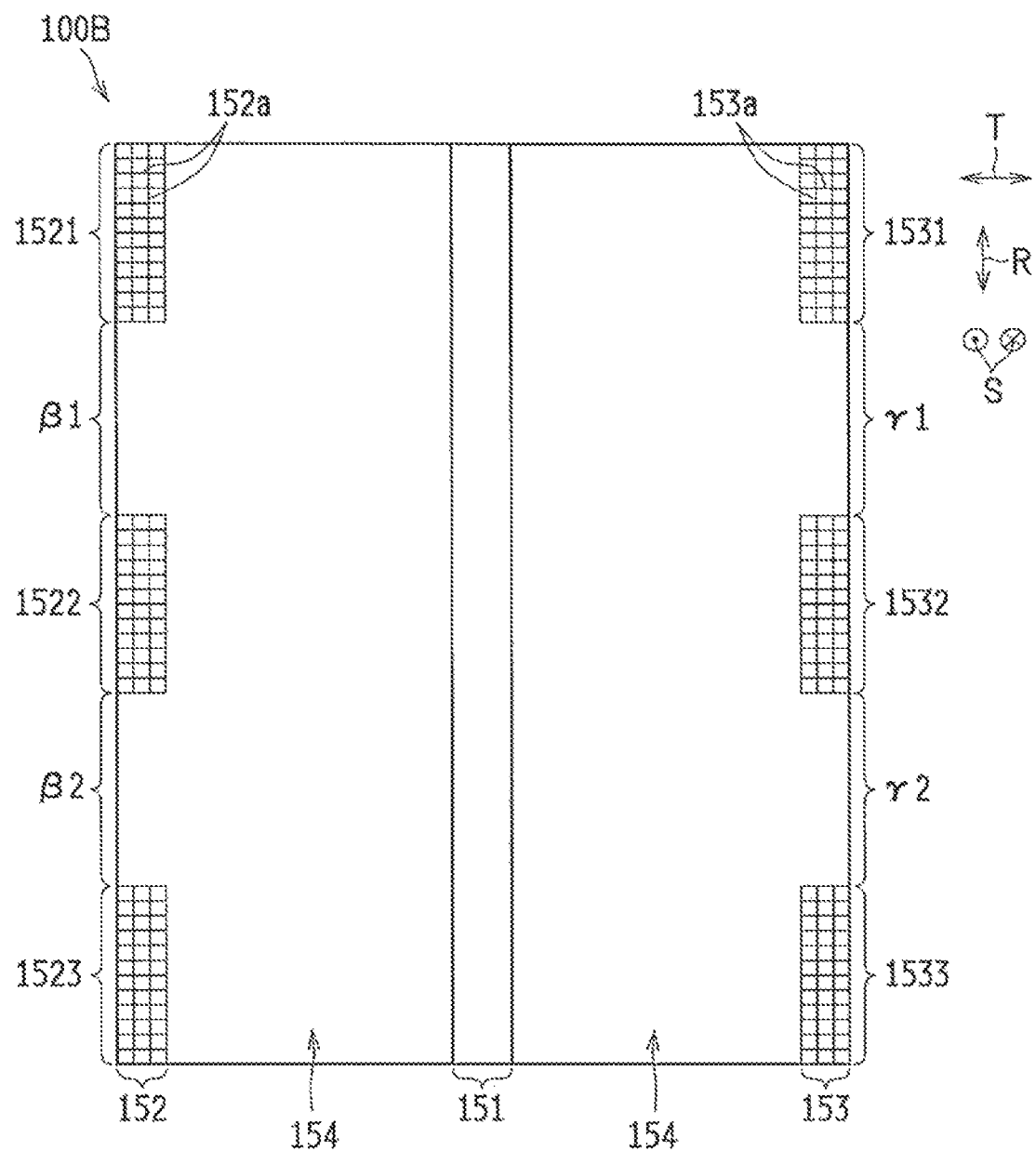
FIG. 5 is a schematic plan view schematically showing an exemplary semiconductor laser element of Embodiment 2.

FIG. 5 is a schematic plan view schematically showing an exemplary semiconductor laser element 100B of Embodiment 2.

An epitaxial structure of the semiconductor laser element 100B of Embodiment 2 is substantially the same as the epitaxial structure of the semiconductor laser element 100A of Embodiment 1. The semiconductor laser element 100B of Embodiment 2 is manufactured by a manufacturing process that is the same as the manufacturing process of Embodiment 1.

In Embodiment 2, in the semiconductor laser element 100B, the resonator length is 1500 μm, the chip width is 110 μm, and a width H of a ridge portion 151 is 1.7 μm. In the semiconductor laser element 100B, in a resonator direction R, a terrace section 152 is split into a plurality of splitting terraces (three splitting terraces in this example), that is, splitting terraces 1521 to 1523; and a terrace section 153 is split into a plurality of splitting terraces (three splitting terraces in this example), that is, splitting terraces 1531 to 1533. Each of the splitting terraces 1521 to 1523 and each of the splitting terraces 1531 to 1533 are formed with a predetermined width (20 μm in this example) and inwardly of a corresponding one of two side surfaces of the semiconductor laser element 100B in a width direction T. For example, the length of each of the splitting terraces 1521 to 1523 and the length of each of the splitting terraces 1531 to 1533 in the resonator direction R are the same or substantially the same (300 μm in this example). The length of regions (β1 and β2) in the resonator direction R, where the splitting terraces 1521 to 1523 do not exist, is the same or substantially the same as the length of the splitting terraces 1521 to 1523, and the length of regions (γ1 and γ2) in the resonator direction R, where the splitting terraces 1531 to 1533 do not exist, are the same or substantially the same as the length of the splitting terraces 1531 to 1533 (300 μm in this example). However, the lengths are not limited thereto. The length of each of the splitting terraces 1521 to 1523 in the resonator direction R need not be the same as the length of the regions (β1 and β2) in the resonator direction R, where the splitting terraces 1521 to 1523 do not exist, and the length of each of the splitting terraces 1531 to 1533 in the resonator direction R need not be the same as the length of the regions (γ1 and γ2) in the resonator direction R, where the splitting terraces 1531 to 1533 do not exist.

In the semiconductor laser element 100B according to Embodiment 2, compared to existing examples, the grooved portions 154 and 154 can be widened by reducing the size of the terrace sections 152 and 153, as a result of which it is possible to increase the efficiency with which heat is dissipated to a metal electrode (112) having good thermal conductivity from a light-emitting section (105) and to increase operating temperatures compared to operating temperatures of existing semiconductor laser elements.

According to Embodiment 2, since the terrace sections 152 and 153 formed on a corresponding one of two sides of the ridge portion 151 function as supports, even in assembling to a submount, it is possible to prevent problems such as tilting of the semiconductor laser element 100B.

Embodiment 3

Figure 6:
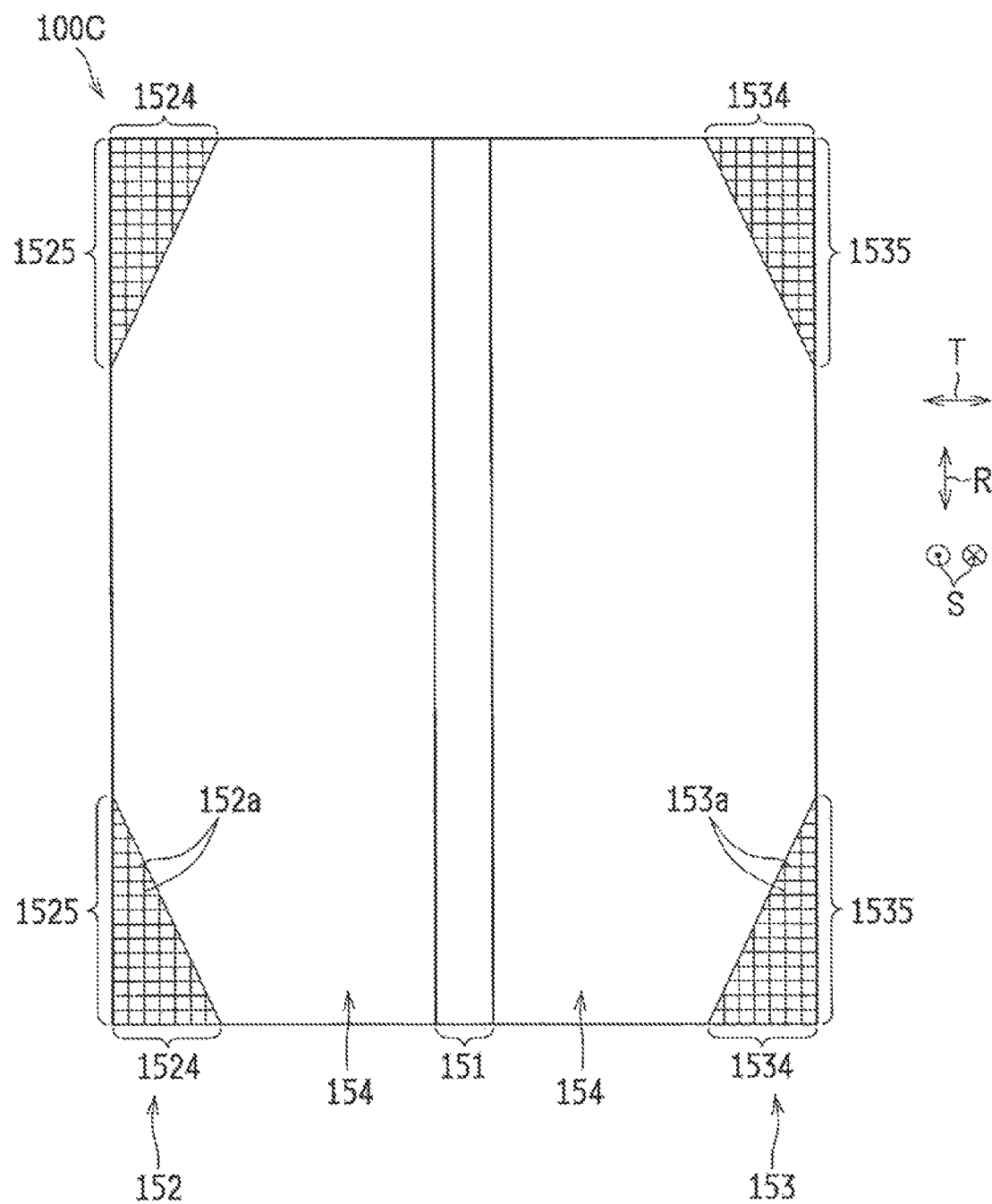
FIG. 6 is a schematic plan view schematically showing an exemplary semiconductor laser element of Embodiment 3.

FIG. 6 is a schematic plan view schematically showing an exemplary semiconductor laser element 100C of Embodiment 3.

An epitaxial structure of the semiconductor laser element 100C of Embodiment 3 is substantially the same as the epitaxial structure of the semiconductor laser element 100A of Embodiment 1. The semiconductor laser element 100C of Embodiment 3 is manufactured by a manufacturing process that is the same as the manufacturing process of Embodiment 1.

In Embodiment 3, in the semiconductor laser element 100C, the resonator length is 800 μm, the chip width is 110 μm, and the width of a ridge portion 151 is 2.0 μm. In the semiconductor laser element 100C, terrace sections 152 and 153 are each formed on corresponding ones of four corners, which are corner portions, two of the corner portions each being where a side of the terrace section 152 along a resonator direction R intersects a corresponding side of the terrace section 152 along a width direction T and two other corner portions being where a side of the terrace section 153 along the resonator direction R intersects a corresponding side of the terrace section 153 along the width direction T. The terrace sections 152 and 153 are formed into triangular shapes such that apex angles correspond to the corner portions of the semiconductor laser element 100C. For example, the dimensions (50 μm in this example) in the resonator direction R of side surface portions 1525 and 1535 on two sides forming a side of the terrace section 152 and a side of the terrace section 153 in the width direction T are, respectively, larger than the dimensions (20 μm in this example) in the width direction T of end surface portions 1524 on two sides of the terrace section 152 in the resonator direction R and the dimensions (20 μm in this example) in the width direction T of end surface portions 1534 on two sides of the terrace section 153 in the resonator direction R.

In the semiconductor laser element 100C according to Embodiment 3, compared to existing examples, the grooved portions 154 and 154 can be widened by reducing the size of the terrace sections 152 and 153, as a result of which it is possible to increase the efficiency with which heat is dissipated to a metal electrode (112) having good thermal conductivity from a light-emitting section (105) and to increase operating temperatures compared to operating temperatures of existing semiconductor laser elements.

According to Embodiment 3, since the terrace sections 152 and 153 formed on corresponding ones of the four corners of the semiconductor laser element 100C function as supports, even in assembling to a submount, it is possible to prevent problems such as tilting of the semiconductor laser element 100C.

Embodiment 4

Figure 7:
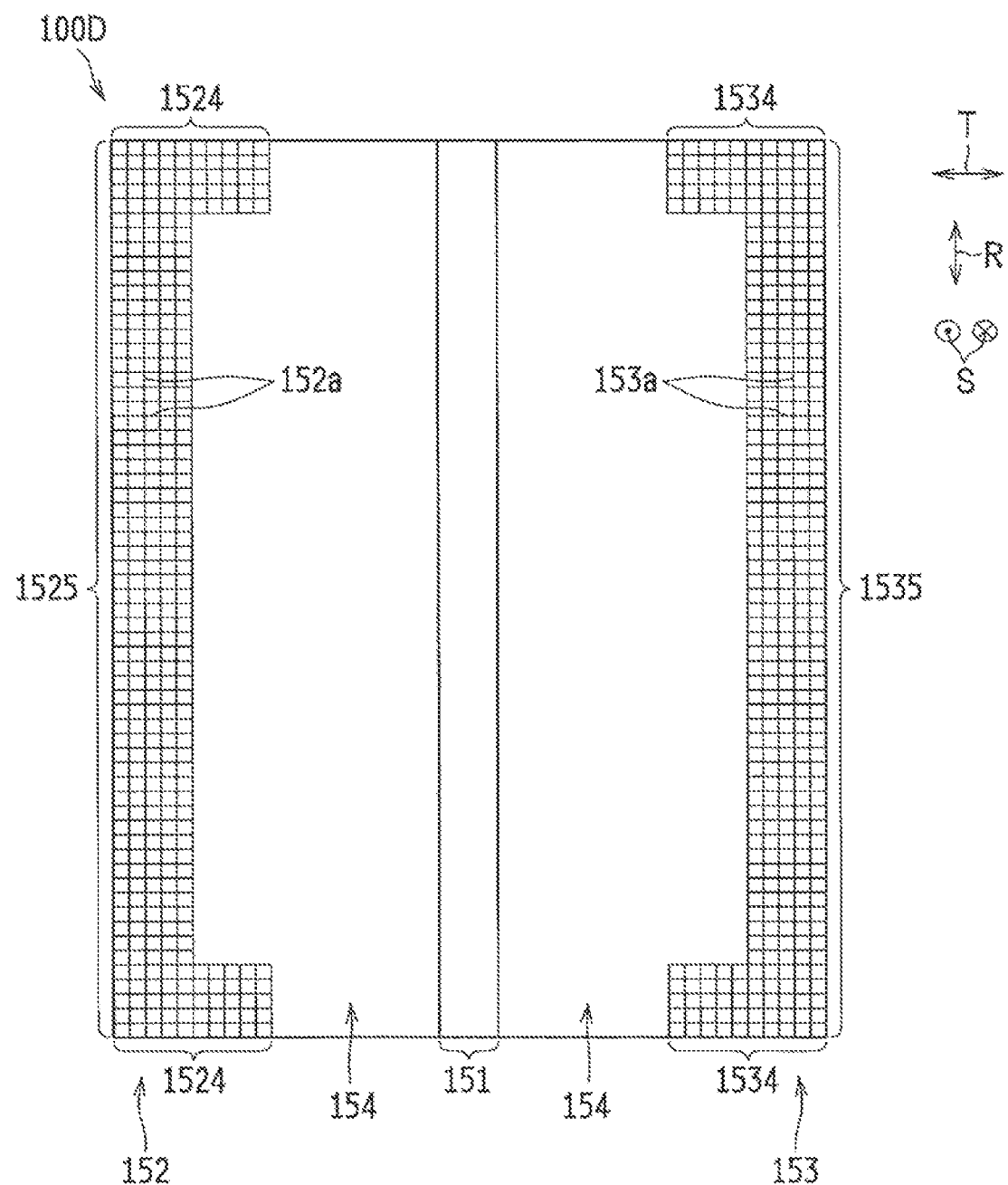
FIG. 7 is a schematic plan view schematically showing an exemplary semiconductor laser element of Embodiment 4.
Figure 8A:
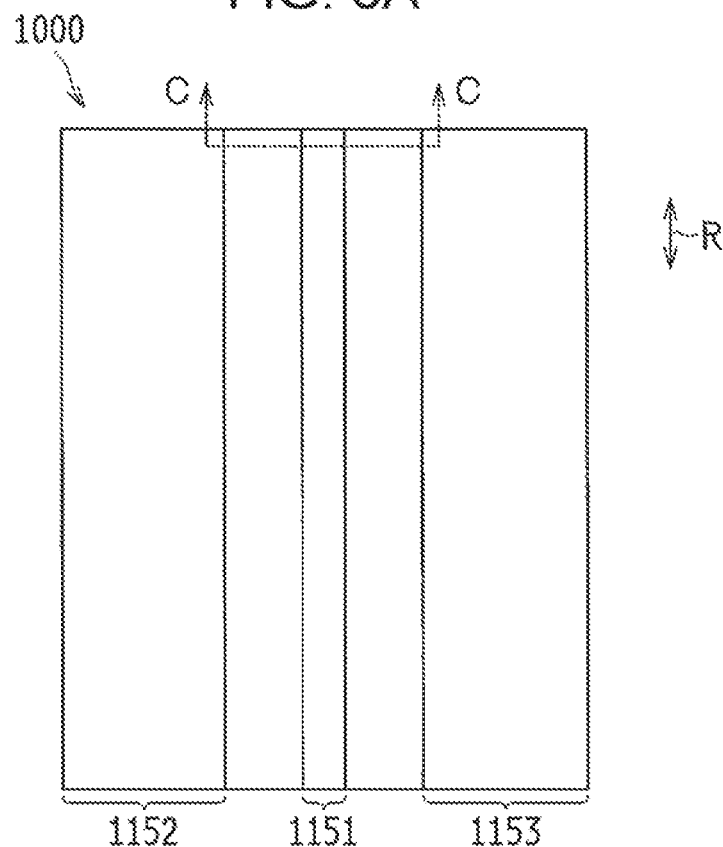
FIG. 8A is a plan view schematically showing an exemplary existing semiconductor laser element.
Figure 8B:
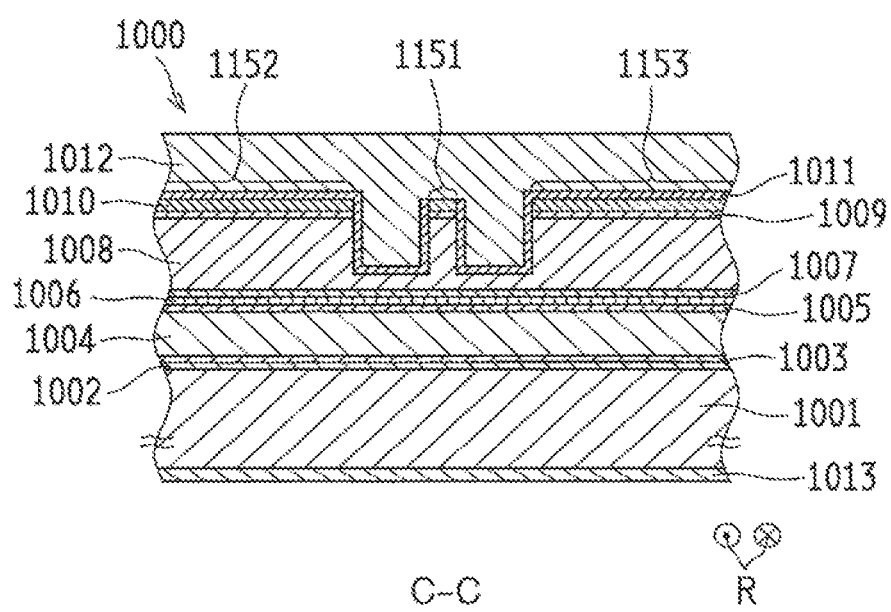
FIG. 8B is a schematic sectional view of the existing semiconductor laser element along line C-C shown in FIG. 8A.

FIG. 7 is a schematic plan view schematically showing an exemplary semiconductor laser element 100D of Embodiment 4.

An epitaxial structure of the semiconductor laser element 100D of Embodiment 4 is substantially the same as the epitaxial structure of the semiconductor laser element 100A of Embodiment 1. The semiconductor laser element 100D of Embodiment 4 is manufactured by a manufacturing process that is the same as the manufacturing process of Embodiment 1.

In Embodiment 4, in the semiconductor laser element 100D, the chip width is 110 µm, and the width of a ridge portion 151 is 1.7 µm. In the semiconductor laser element 100D, terrace sections 152 and 153 are formed with shapes (C shapes) such that the shape of the terrace section 152 is formed along end surface portions 1524 on two sides in a resonator direction R and along a side surface portion 1525, disposed on one of two sides in a width direction T, and such that the shape of the terrace section 153 is formed along end surface portions 1534 on two sides in the resonator direction R and a side surface portion 1535, disposed on the other of two sides in the width direction T. For example, the dimension of the side surface portion 1525 of the terrace section 152 is larger than the dimension of the end surface portions 1524 of the terrace section 152, and the dimension of the side surface portion 1535 of the terrace section 153 is larger than the dimension of the end surface portions 1534 of the terrace section 153. The width in the resonator direction R of each end surface portion 1524 of the terrace section 152 is equal or substantially equal to the width in the width direction T of the side surface portion 1525 of the terrace section 152, and the width in the resonator direction R of each end surface portion 1534 of the terrace section 153 is equal to or substantially equal to the width in the width direction T of the side surface portion 1535 of the terrace section 153; and such widths are, for example, 20 µm.

In the semiconductor laser element 100D according to Embodiment 3, compared to existing examples, the grooved portions 154 and 154 can be widened by reducing the size of the terrace sections 152 and 153, as a result of which it is possible to increase the efficiency with which heat is dissipated to a metal electrode (112) having good thermal conductivity from a light-emitting section (105) and to increase operating temperatures compared to operating temperatures of existing semiconductor laser elements.

According to Embodiment 4, since the terrace sections 152 and 153 formed with C shapes function as supports, even in assembling to a submount, it is possible to prevent problems such as tilting of the semiconductor laser element 100D.

Regarding Embodiments

The semiconductor laser elements 100A to 100D each include a stripe-shaped light-emitting region. The semiconductor laser elements 100A to 100D are each formed by adhering a surface on a side opposite to the semiconductor substrate (101) by a solder layer (not shown). The semiconductor laser elements 100A to 100D each include, on a surface thereof on the side that is adhered by the solder layer, the terrace section 152 that is separated from the ridge portion 151, which is a current-carrying portion, by the grooved portion 154, and the terrace section 153 that is separated from the ridge portion 151, which is a current-carrying portion, by the grooved portion 154; and the top surface of the region including the grooved portions 154 and 154 is covered by the metal (112).

In the semiconductor laser elements 100A to 100D of Embodiments 1 to 4, the terrace sections 152 and 153 are divided into a plurality of portions that are disposed in a scattered manner.

In the semiconductor laser element 100C of Embodiment 3 and the semiconductor laser element 100D of Embodiment 4, the terrace widths, which are widths of the terrace sections 152 and 153 in the width direction T, are not constant (changes) in the resonator direction R, and the terrace widths at at least a part of the corresponding terrace sections 152 and 153 are narrower than a corresponding one of the width of the grooved portion 154 between the terrace section 152 and the ridge portion 151 and the width of the grooved portion 154 between the terrace section 153 and the ridge portion 151.

In the semiconductor laser element 100C of Embodiment 3 and the semiconductor laser element 100D of Embodiment 4, the terrace widths of the terrace sections 152 and 153 in the width direction T are not constant (changes) in the resonator direction R, and the terrace widths over the entire regions in the resonator direction R are narrower than a corresponding one of the width of the grooved portion 154 between the terrace section 152 and the ridge portion 151 and the width of the grooved portion 154 between the terrace section 153 and the ridge portion 151.

According to the embodiments (Embodiments 1 to 4), in a heat-dissipating path, the joining area between the crystal layers (102 to 111) and the metal (112) having a thermal conductivity higher than the thermal conductivities of the crystal layers (102 to 111) can be made larger than before. Therefore, heat generated by the active layer 105 disposed below the ridge portion 151 or heat generated by the ridge portion 151, which is a current path, can efficiently escape to the submount, and the effective temperature of the active layer 105 can be maintained lower than before. As a result, it is possible to enhance the operating temperatures of the semiconductor laser elements 100A to 100D than before.

In the semiconductor laser elements 100A to 100D of Embodiments 1 to 4, the terrace sections 152 and 153 are regularly divided. Therefore, the terrace sections 152 and 153 can stably function as supports, and heat can be uniformly dissipated from the terrace sections to the metal (112).

In an existing semiconductor laser element, when the semiconductor laser element is fixed to a submount, since the thermal expansion coefficient of the semiconductor substrate of the semiconductor laser element differs from the thermal expansion coefficient of the submount, problems occur after the semiconductor laser element has been fixed, such as the polarization characteristics of laser light deteriorating or radiation patterns getting out of shape due to stress acting in the width direction of the ridge portion of the semiconductor laser element perpendicular to the resonator direction and the film thickness direction.

On this point, in the semiconductor laser elements 100A to 100D of Embodiments 1 to 4, the terrace section 152 is divided in the form of a lattice by the plurality of vertical and horizontal recessed portions 152a and the terrace section 153 is divided in the form of a lattice by the plurality of vertical and horizontal recessed portions 153a. When the terrace sections 152 and 153 are divided in this way, it is possible to increase the area of contact with the metal (112) having good heat dissipation and to increase heat dissipation. In addition, it is possible to disperse the stress that is generated when the terrace sections 152 and 153 are fixed and to reduce the stress that is applied to the ridge portion 151. As a result, deterioration in the polarization characteristics of laser light or deterioration in the radiation patterns can be reduced.

The light-emitting section disposed below the ridge portion is mainly the heating section when the semiconductor laser element has been operated. In order to cause heat of the light-emitting section to escape, it is desirable that the distance from the light-emitting section to the metal (metal electrode) having good thermal conductivity be as small as possible. In this sense, grooved portions formed by making the terrace sections as small as possible are effective in allowing easy dissipation of heat from the terrace sections to the metal (metal electrode).

On this point, the semiconductor laser element 100B of Embodiment 2 and the semiconductor laser element 100C of Embodiment 3 each have a structure in which, in the resonator direction R, the terrace sections 152 and 153 are split into a plurality of portions and in which the terrace sections 152 and 153 do not exist in at least a part of locations up to the side-surface regions, which are regions of the side surfaces in the resonator direction R. Therefore, when the supports of the semiconductor laser elements 100B and 100C when the semiconductor laser elements 100B and 100C are fixed to a submount are left, it is possible to increase the effect of allowing heat to be easily dissipated from the semiconductor laser elements 100B and 100C to the metal (112). Consequently, heat can efficiently escape to the submount. As in the semiconductor laser element 100C of Embodiment 3, when the terrace sections 152 and 153 serving as supports are formed at only four corners, their function as supports can be further enhanced.

In the semiconductor laser element 100D of Embodiment 4, the terrace sections 152 and 153 have varying widths in the resonator direction R, and are widest at the end surface portions 1524 on two sides and the end surface portions 1534 on two sides, respectively, in the resonator direction R. Even in this case, similarly to Embodiments 2 and 3, when the supports of the semiconductor laser element 100D when the semiconductor laser element 100D is fixed to a submount is left, it is possible to further increase the effect of allowing heat to be easily dissipated from the semiconductor laser element 100D to the metal (112). Consequently, heat can efficiently escape to the submount. In Embodiment 4, it is desirable that the terrace widths at the narrow portions be as narrower as possible than the widths of the corresponding grooved portions 154 and 154.

The present invention is not limited to the above-described embodiments, and can be carried out in various forms. Therefore, such embodiments are merely illustrative and are not to be construed as restrictive in all respects. The scope of the present invention is defined by the claims and is not restricted in any way by the main text of the description. Further, all modifications and changes within an equivalent scope of the claims are within the scope of the present invention.

The invention claimed is:

1. A semiconductor laser element that includes a stripe-shaped light-emitting region and that is formed by adhering a surface of the semiconductor laser element on a side opposite to a semiconductor substrate and a submount to each other by a solder layer, the semiconductor laser element comprising:
    a terrace section on a surface of the semiconductor laser element that is adhered by the solder layer, the terrace section being separated from a ridge portion, which is a current-carrying portion, by a grooved portion,
    wherein a top surface of a region including the grooved portion is covered by a metal, and the terrace section is divided into a plurality of portions that are disposed in a scattered manner.

2. The semiconductor laser element according to claim 1, wherein the terrace section is regularly divided.

3. The semiconductor laser element according to claim 1, wherein the terrace section is divided in a form of a lattice by vertical and horizontal recessed portions.

4. The semiconductor laser element according to claim 1, wherein the terrace section is split into a plurality of portions in a resonator direction, and the terrace section does not exist in at least a part of a location up to a side-surface region, which is a region of a side surface in the resonator direction.

5. The semiconductor laser element according to claim 1, wherein the terrace section is formed at only regions of four corners.

6. A semiconductor laser element that includes a stripe-shaped light-emitting region and that is formed by adhering a surface of the semiconductor laser element on a side opposite to a semiconductor substrate and a submount to each other by a solder layer, the semiconductor laser element comprising:
    a terrace section on a surface of the semiconductor laser element that is adhered by the solder layer, the terrace section being separated from a ridge portion, which is a current-carrying portion, by a grooved portion,
    wherein a top surface of a region including the grooved portion is covered by a metal, and a terrace width, which is a width of the terrace section, is not constant in a resonator direction, and the terrace width at at least a part of the terrace section is narrower than a width of the grooved portion between the terrace section and the ridge portion.

7. A semiconductor laser element that includes a stripe-shaped light-emitting region and that is formed by adhering a surface of the semiconductor laser element on a side opposite to a semiconductor substrate and a submount to each other by a solder layer, the semiconductor laser element comprising:
    a terrace section on a surface of the semiconductor laser element that is adhered by the solder layer, the terrace section being separated from a ridge portion, which is a current-carrying portion, by a grooved portion,
    wherein a top surface of a region including the grooved portion is covered by a metal, a terrace width, which is a width of the terrace section, is not constant in a resonator direction, and the terrace width over an entire region in the resonator direction is narrower than a width of the grooved portion between the terrace section and the ridge portion.

* * * * *